United States Patent
Ritter et al.

(10) Patent No.: US 10,204,737 B2
(45) Date of Patent: Feb. 12, 2019

(54) LOW NOISE CAPACITORS

(71) Applicant: AVX Corporation, Fountain Inn, SC (US)

(72) Inventors: Andrew P. Ritter, Simpsonville, SC (US); Carl L. Eggerding, Greenville, SC (US)

(73) Assignee: AVX CORPORATION, Foutain Inn, SC (US)

(*) Notice: Subject to any disclaimer, the term of this patent is extended or adjusted under 35 U.S.C. 154(b) by 0 days.

(21) Appl. No.: 14/733,029

(22) Filed: Jun. 8, 2015

(65) Prior Publication Data
US 2015/0364254 A1 Dec. 17, 2015

Related U.S. Application Data

(60) Provisional application No. 62/010,488, filed on Jun. 11, 2014.

(51) Int. Cl.
*H01G 2/06* (2006.01)
*H01G 4/30* (2006.01)
(Continued)

(52) U.S. Cl.
CPC .............. *H01G 2/065* (2013.01); *H01G 4/224* (2013.01); *H01G 4/232* (2013.01);
(Continued)

(58) Field of Classification Search
CPC ........ H01G 2/065; H01G 4/224; H01G 4/232; H01G 4/2325; H01G 4/30; H01G 4/12;
(Continued)

(56) References Cited

U.S. PATENT DOCUMENTS

| | | |
|---|---|---|
| 3,785,895 A | 1/1974 | Ettre et al. |
| 4,327,482 A | 5/1982 | Araki et al. |

(Continued)

FOREIGN PATENT DOCUMENTS

| | | |
|---|---|---|
| CN | 1462175 | 12/2003 |
| CN | 1649047 | 5/2009 |

(Continued)

OTHER PUBLICATIONS

Machine translation of Abstract of KR 10-2000-0047547.
(Continued)

*Primary Examiner* — Dion Ferguson
(74) *Attorney, Agent, or Firm* — Dority & Manning, P.A.

(57) ABSTRACT

Relatively low noise capacitors are provided for surface mounted applications. Electro-mechanical vibrations generate audible noise, which are otherwise relatively reduced through modifications to MLCC device structures, and/or their mounting interfaces on substrates such as printed circuit boards (PCBs). Different embodiments variously make use of flexible termination compliance so that surface mounting has reduced amplitude vibrations transmitted to the PCB. In other instances, side terminal and transposer embodiments effectively reduce the size of the mounting pads relative to the case of the capacitor, or a molded enclosure provides standoff, termination compliance and clamping of vibrations.

8 Claims, 11 Drawing Sheets

(51) Int. Cl.
  *H01G 4/224* (2006.01)
  *H01G 4/232* (2006.01)
  *H05K 3/34* (2006.01)
  *H01G 4/12* (2006.01)
  *H05K 1/18* (2006.01)

(52) U.S. Cl.
  CPC ............ *H01G 4/2325* (2013.01); *H01G 4/30* (2013.01); *H05K 3/3442* (2013.01); *H01G 4/12* (2013.01); *H05K 1/181* (2013.01); *H05K 2201/10015* (2013.01); *H05K 2201/2045* (2013.01); *Y02P 70/613* (2015.11); *Y10T 29/51* (2015.01)

(58) Field of Classification Search
  CPC ................ H05K 3/3442; H05K 1/181; H05K 2201/10015; H05K 2201/2045; Y10T 29/51; Y02P 70/613
  See application file for complete search history.

(56) References Cited

U.S. PATENT DOCUMENTS

| | | | |
|---|---|---|---|
| 4,454,529 A | 6/1984 | Philofsky et al. | |
| 4,458,294 A | 7/1984 | Womack | |
| 4,527,185 A | 7/1985 | Philofsky et al. | |
| 4,561,954 A | 12/1985 | Scrantom et al. | |
| 5,229,640 A | 7/1993 | Pak | |
| 5,267,379 A | 12/1993 | Pak | |
| 5,527,443 A | 6/1996 | Chan | |
| 5,565,838 A | 10/1996 | Chan | |
| 5,629,578 A | 5/1997 | Winzer et al. | |
| 5,656,856 A | 8/1997 | Kweon | |
| 5,889,445 A | 3/1999 | Ritter et al. | |
| 5,898,562 A | 4/1999 | Cain et al. | |
| 6,324,047 B1 | 11/2001 | Hayworth | |
| 6,381,117 B1 | 4/2002 | Nakagawa et al. | |
| 6,459,561 B1 | 10/2002 | Galvagni et al. | |
| 6,477,032 B2 | 11/2002 | Makl, Jr. | |
| 6,493,207 B2 | 12/2002 | Nakano et al. | |
| 6,496,355 B1 | 12/2002 | Galvagni et al. | |
| 6,898,070 B2 | 5/2005 | Korony et al. | |
| 6,903,919 B2 | 6/2005 | Kayatani et al. | |
| 6,942,901 B1 | 9/2005 | Van Tassel et al. | |
| 6,958,899 B2 | 10/2005 | Togashi et al. | |
| 7,054,136 B2 | 5/2006 | Ritter et al. | |
| 7,057,878 B2 | 6/2006 | Vierow et al. | |
| 7,310,217 B2 | 12/2007 | Takashima et al. | |
| 7,352,563 B2 | 4/2008 | Pelcak et al. | |
| 7,714,688 B2 | 5/2010 | Korony et al. | |
| 7,715,171 B2 | 5/2010 | Nakano et al. | |
| 7,719,819 B2 | 5/2010 | Motoki et al. | |
| 7,719,852 B2 | 5/2010 | Horie et al. | |
| 7,724,495 B2 | 5/2010 | Fuhrmann et al. | |
| 7,724,496 B2 | 5/2010 | Eggerding et al. | |
| 7,760,487 B2 | 7/2010 | Karnik | |
| 7,760,488 B2 | 7/2010 | Breznova et al. | |
| 7,768,773 B2 | 8/2010 | Breznova et al. | |
| 7,824,452 B2 | 11/2010 | Jones et al. | |
| 7,852,615 B2 | 12/2010 | Breznova et al. | |
| 7,859,821 B2 | 12/2010 | Shimizu | |
| 7,989,895 B2 | 8/2011 | White et al. | |
| 8,122,418 B2 | 2/2012 | Uchida | |
| 8,125,765 B2 | 2/2012 | Ishida et al. | |
| 8,203,827 B2 | 6/2012 | Karnik | |
| 8,218,292 B2 | 7/2012 | Rezai-Kalantary | |
| 8,254,083 B2 | 8/2012 | Sakurai et al. | |
| 8,259,436 B2 | 9/2012 | Petrzilek et al. | |
| 8,300,387 B1 | 10/2012 | Zednickova et al. | |
| 8,310,805 B2 | 11/2012 | Tashima et al. | |
| 8,344,282 B2 | 1/2013 | Dvorak et al. | |
| 8,456,434 B2 | 6/2013 | Moon et al. | |
| 8,618,422 B2 | 12/2013 | Fujii et al. | |
| 8,665,059 B2 | 3/2014 | Korony et al. | |
| 8,674,234 B2 | 3/2014 | Yoshii et al. | |
| 8,842,415 B2 | 9/2014 | Ahn et al. | |
| 9,251,956 B2 | 2/2016 | Kang et al. | |
| 2003/0231477 A1 | 12/2003 | Vierow et al. | |
| 2007/0139861 A1 | 6/2007 | Nakano et al. | |
| 2007/0165361 A1 | 7/2007 | Randall et al. | |
| 2008/0158773 A1 | 7/2008 | Lee et al. | |
| 2008/0259575 A1 | 10/2008 | Tanimura et al. | |
| 2009/0095542 A1 | 4/2009 | Moon et al. | |
| 2009/0185326 A1 | 7/2009 | Kato et al. | |
| 2009/0310276 A1 | 12/2009 | Tashima et al. | |
| 2011/0090665 A1 | 4/2011 | Korony et al. | |
| 2012/0152604 A1 | 6/2012 | Ahn et al. | |
| 2012/0268875 A1 | 10/2012 | Ahn et al. | |
| 2013/0050894 A1 | 2/2013 | Ahn et al. | |
| 2013/0088810 A1* | 4/2013 | Yang .................. H01G 4/2325 361/306.3 |
| 2013/0107419 A1 | 5/2013 | Hill et al. | |
| 2013/0134995 A1 | 5/2013 | Moon et al. | |
| 2013/0284507 A1 | 10/2013 | Hattori et al. | |
| 2013/0294006 A1* | 11/2013 | Kang .................. H01G 4/2325 361/301.4 |
| 2013/0299224 A1 | 11/2013 | Hattori et al. | |
| 2014/0016242 A1 | 1/2014 | Hattori et al. | |
| 2014/0116768 A1 | 5/2014 | Hattori et al. | |
| 2014/0124256 A1 | 5/2014 | Hattori et al. | |
| 2014/0194964 A1 | 7/2014 | Woods et al. | |
| 2014/0268486 A1 | 9/2014 | Hattori et al. | |
| 2014/0268488 A1 | 9/2014 | Hattori et al. | |
| 2014/0284091 A1* | 9/2014 | Fujii ....................... H01G 4/30 174/260 |
| 2016/0104552 A1 | 4/2016 | Kang et al. | |

FOREIGN PATENT DOCUMENTS

| | | |
|---|---|---|
| CN | 201247691 | 5/2009 |
| CN | 103703526 | 4/2014 |
| CN | 103382282 B | 12/2016 |
| EP | 2 101 337 | 9/2009 |
| JP | 2003-007574 | 1/2003 |
| JP | 2003-282332 | 10/2003 |
| JP | 2004-193352 | 7/2004 |
| JP | 2004-259991 | 9/2004 |
| JP | 2005-2017136 | 8/2005 |
| JP | 2009-164446 | 7/2009 |
| JP | 2013-153231 | 8/2013 |
| JP | 5459444 | 4/2014 |
| KR | 2000-0047547 | 7/2000 |
| KR | 2004-0082995 | 9/2004 |
| KR | 2008-0019893 | 3/2008 |
| KR | 2009-0098698 | 9/2009 |
| KR | 10-2003-0072697 | 7/2010 |
| KR | 2010-0131716 | 12/2010 |
| KR | 101058697 | 8/2011 |
| TW | 275137 | 5/1996 |
| TW | 201025056 | 7/2010 |
| TW | 201031932 A | 9/2010 |
| WO | WO 2013/008549 A | 1/2013 |

OTHER PUBLICATIONS

Machine translation of Abstract of JP 2003-007574.
Machine translation of Abstract of JP 2003-282332.
Machine translation of Abstract of CN 1462175.
Machine translation of Abstract of JP 2004-193352.
Machine translation of Abstract of JP 2004-259991.
Machine translation of Abstract of KR 10-2004-008995.
Machine translation of Abstract of JP 2005-217136.
Machine translation of Abstract of KR 10-2008-0019893.
Machine translation of Abstract of CN 1649047.
Machine translation of Abstract of JP 2009-164446.
Machine translation of Abstract of KR 10-2009-0098698.
Machine translation of Abstract of KR 10-2003-0072697.
Machine translation of Abstract of KR 10-2010-0131716.
Machine translation of Abstract of KR 101058697.
Machine translation of WO2013008549A.
Machine translation of JP 2013-48069.

(56) References Cited

OTHER PUBLICATIONS

Machine translation of Abstract of JP 2013-153231.
Machine translation of Abstract of JP 5459444.
Chinese Search Report dated Nov. 14, 2017; 2 pages.
Taiwanese Search Report dated Aug. 9, 2018, 1 page.

* cited by examiner

Standard MLC

FIG. 6A    FIG. 6B

Standard (Prior Art) MLC
(8-Terminal)

Side Terminal Embodiment (MLC Transposer)

(Component Side)

(Board Side)

LOW NOISE CAPACITORS

PRIORITY CLAIM

This application claims the benefit of previously filed U.S. Provisional Patent Application entitled "LOW NOISE CAPACITORS," assigned U.S. Ser. No. 62/010,488, filed Jun. 11, 2014, and which is incorporated herein by reference for all purposes.

FIELD OF THE SUBJECT MATTER

The presently disclosed technology relates to low noise capacitors and corresponding methodologies. More particularly, the presently disclosed technology relates to construction and surface mounting of capacitor devices on substrates such as printed circuit boards (PCB's) so as to provide both mechanical and electrical connection with relatively low noise characteristics (i.e., electro-mechanical noise reduction).

BACKGROUND OF THE SUBJECT MATTER

High density mounting of electronic components on printed circuit boards and other substrates is common in the electronics industry. Miniature ceramic surface mount type capacitors having multiple layers have been used for some time in electronic devices such as cellular telephones, network routers, computers, and the like. The manufacturing techniques of such devices must be precise to provide for the greatly reduced size of these devices, while still affording desirable electrical operating characteristics.

More recently it has become desirable to provide further types of components and various sub-circuits in on-board mountable form. Several United States Patents are directed to various aspects of electronic component manufacture and mounting techniques. For example, commonly owned U.S. Pat. No. 5,889,445 (Ritter et al., entitled "Multilayer Ceramic RC Device") discloses RC devices which include a plurality of first and second ceramic layers interleaved to form a stack. The ceramic layers each include a suitable electrode structure of opposite polarity forming the equivalent of multiple two-plate capacitors. Known embodiments of multilayer ceramic capacitors (MLCC's) are also shown, for example, in FIGS. 2 and 3 of commonly owned U.S. Pat. No. 7,352,563 (Pelcak et al., entitled "Capacitor assembly").

The diversity of modern technical applications creates a need for efficient electronic components and integrated circuits for use therein. Capacitors are a fundamental component used for filtering, decoupling, bypassing and other aspects of such modern applications which may include wireless communications, high-speed processing, networking, circuit switching and many other applications. Dramatic increases in the speed and packing density of integrated circuits has resulted in advancements in decoupling capacitor technology.

When high-capacitance decoupling capacitors are subjected to the high frequencies of many present applications, performance characteristics become increasingly more important. Since capacitors are fundamental to such a wide variety of applications, their precision and efficiency is imperative. Many specific aspects of capacitor design have thus been a focus for improving the performance characteristics of capacitors.

A wide variety of conventional capacitors are available on the market today, and each provides a unique combination of performance characteristics well-suited for particular applications. For example, multilayer ceramic capacitors (MLCCs) are typically quite effective for frequency filtering applications. It is quite common that these and other particular capacitor types will be used in a single integrated circuit environment. In such instances, the different capacitors may be connected, for example, in parallel on a printed circuit board (PCB) as discrete components. Such approach may require a relatively large amount of circuit space and separate mounting pads for each capacitor.

For some time, the design of various electronic components has been driven by a general industry trend toward miniaturization and ease of incorporation of components into new or existing applications. In such regard, a need exists for smaller electronic components having exceptional operating characteristics. For example, some applications require the use of passive devices exhibiting various characteristics including capacitive, inductive, and/or resistive characteristics or combination assemblies thereof, but are severely limited in the amount of space (known as "real estate") such devices may occupy on a circuit board. It is important that such devices or combinations be configured for maximum ease of physical and electrical attachment to such circuit boards while occupying the least amount of "real estate" possible. As a result, efforts continue to strive for component miniaturization, orientation efficiency and other ways to save space and maximize board real estate in a PCB environment.

It may also be desirable to improve other capacitor performance characteristics, such as ESR (Equivalent Series Resistance), which is the inherent resistance value of a capacitor.

Another capacitor characteristic that may affect circuit applications is piezoelectric noise or electro-mechanical or acoustic noise, which is prevalent in many mounted MLCC applications. Low level piezoelectric noise may be generated, for example, when the capacitor ceramics are subjected to alternate voltages, which can cause mechanical vibrations in the capacitor. The inherent nature of the ceramic material converts the mechanical vibrations to generally low-level electrical noise. Significant amounts of piezoelectric noise can have an effect on signal quality, especially in high frequency applications. As such, it is often desirable to reduce piezoelectric noise levels in circuit applications.

Capacitors deform in response to applied voltage (electric field) due to electrostrictive behavior inherent in all dielectric materials, as expressed by the following known equation:

$$\text{Strain} = M_{ij} * \text{Electric Field}^2$$

In general, high dielectric constant materials have high electrostrictive coefficients. A CV (capacitance times voltage) rating is related in part to the volumetric efficiency of a capacitor. In general, the higher the capacitance, the larger the volume of the capacitor. Given some capacitance value, the higher the voltage rating, the larger the volume of the capacitor. Thus, when a capacitor has a "high CV rating", that means that it is volumetrically efficient, and offers a small physical size compared to other capacitor types. High CV capacitors have evolved to have very thin internal layers, giving very high electric field strength even at modest operating voltage.

Mechanical strain (vibrations) may be transferred from the capacitor through the solder terminals to PCB substrates. The capacitor acts as a driver, in essence, a drum stick, while the PCB behaves as a sounding instrument, such as a drum head. Therefore, the predominant audible noise is generated by vibrations from the PCB, not the capacitor itself.

A converse effect, that is, vibrations on PCB coupled through terminals to the capacitor, can also cause an AC-ripple voltage on the capacitor. Such an effect is called "microphonics" and can be a problem in special cases.

Various approaches have been previously provided in attempts to reduce electro-mechanical noise associated with mounted MLCC devices, and include such as minimizing solder amount (for mounting of device onto a PCB), turning the orientation of MLCC internal layers parallel to PCB, using lower K dielectric materials, increasing stand-off (leads), pre-mounting capacitors on substrate, increasing clamping force (for providing larger inactive margins), and simply replacing the MLCC devices with a different type of device such as a tantalum capacitor. Such approaches inherently involve various tradeoffs, for example, in some instances, increased costs or increased complexity of MLCC device designs or mounting techniques.

Additional patent citations include U.S. Pat. No. 5,629,578 (Winzer et al., entitled "Integrated composite acoustic transducer array"), related to a multilayer structure which has associated noise cancellation features, and U.S. Pat. No. 8,665,059 (Korony et al., entitled "High Frequency Resistor"), related to a resistor having flexible termination material. See, also, Korony U.S. Application Publication No. 2011/0090665 entitled "Thin Film Surface Mount Components" and Hattori U.S. Application Publication Nos. 2014/0016242 entitled "Electronic Component", 2013/0299224 entitled "Ceramic Electronic Component and Electronic Device", and 2013/0284507 entitled "Electronic Component."

The presently disclosed subject matter relates generally to small electronic components adapted to be surface mounted on a larger circuit board. More particularly, the subject matter may relate to a surface mount capacitor device for use in a variety of applications. According to industry practice, the size of a surface mount component is generally expressed as a number "XXYY," with XX and YY being the length and width, respectively, in hundredths of an inch.

While various implementations of capacitor devices and associated assemblies and mounting methodologies therefor have been developed, no design has emerged that generally encompasses all of the desired characteristics as hereafter presented in accordance with the subject technology.

SUMMARY OF THE SUBJECT MATTER

The presently disclosed subject matter recognizes and addresses several of the foregoing issues, and others concerning certain aspects of capacitor devices. Thus, broadly speaking, an object of certain embodiments of the presently disclosed technology is to provide improved designs for certain capacitor components and component assemblies associated with the implementation of surface mountable devices. Other objects, broadly speaking relate to providing low noise capacitors and related methodologies.

Other present objects relate to construction and surface mounting of capacitor devices on substrates such as printed circuit boards (PCB's) so as to provide both mechanical and electrical connection with improved, relatively low noise characteristics (i.e., electro-mechanical noise reduction).

Aspects of other exemplary embodiments of the presently disclosed subject matter provide improved electrical and mechanical coupling of certain surface mount devices to circuits or traces on a printed circuit board on which the device may be mounted, for improved noise performance characteristics.

Still further aspects of yet still other embodiments of the presently disclosed subject matter provide enhancements to manufacturing and/or mounting methodologies associated with the use of surface mount type devices.

Still further, it is to be understood that the presently disclosed technology equally applies to the resulting devices and structures disclosed and/or discussed herewith, as well as the corresponding involved methodologies.

Yet further aspects of still other embodiments of the presently disclosed subject matter provide compliant termination features for noise reduction aspects. Other presently disclosed embodiments relate to advantageous relocation of terminals of a surface mount capacitor. Still additional presently disclosed embodiments relate to enclosure of a capacitor, such as in an epoxy case. Yet other presently disclosed embodiments may relate to pre-mounting of capacitors on a so-called transposer component or element.

It is a further general object to provide relatively low manufacturing costs combined with relatively improved noise reduction in surface mounted capacitor devices.

Yet further still it should be appreciated that certain aspects of the presently disclosed subject matter may be applied to individual active components or combinations thereof with passive components. For example, active combinations including, but not limited to, amplifiers, oscillators, and other functional block assemblies may benefit from the presently disclosed technology.

It is also an object to provide improved devices and/or associated methodologies resulting in low noise, surface mounted capacitor devices useful, for example, in audio circuits in hand-held electronics, in automotive electronics, in computer disk drives, and useful in specialty industrial, aerospace, and medical applications.

One presently disclosed exemplary embodiment relates to a surface mountable relatively low noise multilayer ceramic capacitor (MLCC) capacitor assembly. Such a capacitor assembly preferably comprises a main body having a plurality of conductive layers of respective first and second polarities interleaved with a plurality of ceramic layers to form respective pairs of opposing capacitor plates in a stacked arrangement; and respective first and second polarity terminations on opposite ends of such main body and electrically connected, respectively, to such first and second polarity conductive layers. Further, such terminations include a compliant layer for relatively dampening vibrations between such capacitor assembly and a surface on which it is mounted for relatively reducing electro-mechanical noise.

In some such embodiments, such compliant layer may comprise a layer of compliant polymer. In various such embodiments, such compliant polymer may comprise a generally conductive polymer, or a conductive polymer which is a silver-polymer layer, or one which is one of silver, copper or nickel filled polymers.

In other alternatives of such embodiment, such surface may comprise a supporting substrate. In various such embodiments, such supporting substrate may comprise a printed circuit board, and such compliant polymer layer may have a Modulus of Elasticity of generally less than 5 GPa, so that surface mounting of such capacitor assembly has reduced amplitude vibrations transmitted to the printed circuit board, so as to provide both mechanical and electrical connection with relatively low noise characteristics.

In various alternatives of such embodiments, such terminations may comprise a silver polymer over a relatively thinner flashing layer, and/or such flashing layer may comprise a copper layer, or further alternatively, such terminations may comprise a silver polymer over a relatively thinner copper flashing layer, and with a layer of plating over such silver polymer layer. In some such alternatives, such layer of plating may comprise nickel-tin plating.

The presently disclosed subject matter is intended to equally relate to corresponding and/or related methods. One such presently disclosed exemplary embodiment relates to methodology for relatively reducing electro-mechanical noise associated with a surface mountable multilayer ceramic capacitor (MLCC) capacitor assembly. Such exemplary methodology preferably includes providing a main body having a plurality of conductive layers of respective first and second polarities interleaved with a plurality of ceramic layers to form respective pairs of opposing capacitor plates in a stacked arrangement; and forming respective first and second polarity terminations on opposite ends of such main body and electrically connected, respectively, to such first and second polarity conductive layers. Further, preferably such terminations include a compliant layer for relatively dampening vibrations between such capacitor assembly and a surface on which it is mounted for relatively reducing electro-mechanical noise.

In some alternatives of such exemplary methodology, such compliant layer may comprise a layer of compliant polymer. Per other alternatives, such compliant polymer may comprise generally conductive polymer comprising one of silver, copper or nickel filled polymers.

Variations of such exemplary methodology may further include surface mounting such capacitor assembly on a supporting substrate comprising a printed circuit board, so that surface mounting of such capacitor assembly has reduced amplitude vibrations transmitted to the printed circuit board, so as to provide both mechanical and electrical connection with relatively low noise characteristics.

In other presently disclosed variations, such terminations may comprise a silver polymer over a relatively thinner copper flashing layer, or may comprise a silver conductive polymer over a relatively thinner copper flashing layer, and with a layer of plating over such silver conductive polymer layer.

Per yet another presently disclosed exemplary embodiment, a surface mountable relatively low noise multilayer ceramic capacitor (MLCC) capacitor assembly preferably comprises a main body having a plurality of conductive layers of respective first and second polarities interleaved with a plurality of ceramic layers to form respective pairs of opposing capacitor plates in a stacked arrangement; respective first and second polarity terminations on opposite ends of such main body and electrically connected, respectively, to such first and second polarity conductive layers; and a molded case in which such main body is received with such terminations supported on a surface, for relatively dampening vibrations between such capacitor assembly and a surface on which it is mounted for relatively reducing electro-mechanical noise.

In some variations of such exemplary embodiment, such molded case may comprise an epoxy case completely encapsulating such main body. In some instances, such conductive layers may be arranged vertically relative to a surface on which such terminations are supported, though in other instances the arrangement may be other than vertical. In further such variations, such molded case may comprise an A-case package mounted as a land grid array style package on solder pads of a predetermined size case. In other alternatives, such predetermined size case may comprise dimensions of a 1206 A-case package, where such dimensions comprise the length and width, respectively, of such case expressed in hundredths of an inch. As understood by those of ordinary skill in the art, A-case is industry terminology for a 1206-sized equivalent device. It should be appreciated that the presently disclosed subject matter is equally applicable to other sizes and arrangements. For example, it may also be practiced with B-case (1210 equivalent size) and R- and N-case (0805 equivalent size). Also, the presently disclosed subject matter may be practiced to mount A-, B-, R- and N-case parts on industry standard mounting pads (1206, 1210, 0805 and 0805, respectively) and also to mount same A-, B-, R- and N-case on one size smaller mounting pads (1206, 0805, 0603 and 0603, respectively). This later method places the solder pads under the part (aka, Land Grid Array style) and effectively eliminates the large solder fillet from the end of the molded capacitor, which in turn reduces clamping stress and vibrations coupled from capacitor to mounting substrate.

Per other alternatives, such surface may comprise a supporting substrate. In some instances, such supporting substrate may comprise a printed circuit board, and such molded case may comprise a molded package having a polymer coating and a lead frame. In some such instances, such main body may be received with such conductive layers arranged vertically relative to a surface on which such terminations are supported, though in other arrangements they may be arranged other than vertically, to decouple capacitor distortion from the printed circuit board to dampen device noise by reducing the amplitude of vibrations transmitted to the printed circuit board, so as to provide both mechanical and electrical connection thereto with relatively low noise characteristics.

In other variations, such terminations may comprise nickel-tin plating over a copper film.

Another presently disclosed exemplary embodiments may relate to corresponding methodology for relatively reducing electro-mechanical noise associated with a surface mountable multilayer ceramic capacitor (MLCC) capacitor assembly. An exemplary such methodology may comprise providing a main body having a plurality of conductive layers of respective first and second polarities interleaved with a plurality of ceramic layers to form respective pairs of opposing capacitor plates in a stacked arrangement; forming respective first and second polarity terminations on opposite ends of such main body and electrically connected, respectively, to such first and second polarity conductive layers; and placing such main body in a molded case with such terminations supported on a surface, for relatively dampening vibrations between such capacitor assembly and a surface on which it is mounted for relatively reducing electro-mechanical noise.

In variations of the foregoing, such molded case may comprise an epoxy case completely encapsulating such main body. In some instances, such conductive layers may be arranged vertically relative to a surface on which terminations are supported, though in other arrangements other than vertical may be practiced. In some other variations, such molded case may comprise an A-case package mounted as a land grid array style package on solder pads of a predetermined size case.

Per other variations, such surface may comprise a supporting substrate, and/or such supporting substrate may comprise a printed circuit board, and such molded case may comprise a molded package having a polymer coating and a lead frame. In some instances such main body may be received with such conductive layers arranged vertically relative to a surface on which such terminations are supported, though in other arrangements other than vertically may be practiced, to decouple capacitor distortion from the printed circuit board to dampen device noise by reducing the amplitude of vibrations transmitted to the printed circuit board, so as to provide both mechanical and electrical connection thereto with relatively low noise characteristics.

In yet other variations, such terminations may comprise nickel-tin plating over a copper film, and/or the length of such terminations and the location of attachments points thereof may be predetermined for further decoupling vibrations transmitted to the printed circuit board from such capacitor assembly.

Another presently disclosed exemplary embodiment relates to a surface mountable relatively low noise multilayer ceramic capacitor (MLCC) capacitor assembly, preferably comprising a main body having a plurality of conductive layers of respective first and second polarities interleaved with a plurality of ceramic layers to form respective pairs of opposing capacitor plates in a stacked arrangement; and respective first and second polarity terminations on opposite sides of such main body and electrically connected, respectively, to such first and second polarity conductive layers with such terminations supported on a surface, for relatively reducing supportive and connective footprint between such capacitor assembly and a surface on which it is mounted for relatively reducing vibration force transmission therebetween for reducing electro-mechanical noise.

In some variations of the foregoing, such surface may comprise a supporting substrate, and/or such supporting substrate may comprise a printed circuit board, so that surface mounting of such capacitor assembly has reduced amplitude vibrations transmitted to the printed circuit board, so as to provide both mechanical and electrical connection with relatively low noise characteristics.

In other present alternatives, such terminations may comprise a layer of nickel-tin plating, or may comprise nickel-tin plating over a copper film, and/or such copper film may comprise a relatively thick film of copper.

One presently disclosed exemplary corresponding method may relate to methodology for relatively reducing electro-mechanical noise associated with a surface mountable multilayer ceramic capacitor (MLCC) capacitor assembly, preferably comprising providing a main body having a plurality of conductive layers of respective first and second polarities interleaved with a plurality of ceramic layers to form respective pairs of opposing capacitor plates in a stacked arrangement; forming respective first and second polarity terminations on opposite sides of such main body and electrically connected, respectively, to such first and second polarity conductive layers; and supporting such terminations on a surface, wherein a relatively reduced supportive and connective footprint is formed between such capacitor assembly and such surface on which it is supported for relatively reducing vibration force transmission therebetween for reducing electro-mechanical noise.

In alternatives thereof, such surface may comprise a supporting substrate, and/or such supporting substrate may comprise a printed circuit board, so that surface mounting of such capacitor assembly has reduced amplitude vibrations transmitted to the printed circuit board, so as to provide both mechanical and electrical connection with relatively low noise characteristics.

In other variations, such terminations may comprise a layer of nickel-tin plating, and/or may comprise nickel-tin plating over a copper film. In some instances, such copper film may comprise a relatively thick film of copper.

Yet another presently disclosed exemplary embodiment may relate to a surface mountable relatively low noise multilayer ceramic capacitor (MLCC) capacitor assembly, preferably comprising a main body having a plurality of conductive layers of respective first and second polarities interleaved with a plurality of ceramic layers to form respective pairs of opposing capacitor plates in a stacked arrangement; respective first and second polarity terminations on such main body and electrically connected, respectively, to such first and second polarity conductive layers; and a transposer mounting pad attached to such capacitor assembly with such transposer mounting pad supported on a surface, for relatively reducing a supportive and connective footprint between such capacitor assembly and a surface by which it is supported for relatively reducing vibration force transmission therebetween for reducing electro-mechanical noise.

Per some alternatives of the foregoing, a side of such main body facing such surface may form a capacitor mounting pad; and such capacitor assembly may further include a solder mask between such capacitor mounting pad and such transposer mounting pad.

Per other alternatives, such respective first and second polarity terminations may be formed on opposite ends of such main body.

In yet other variations, such surface may comprise a supporting substrate, and/or such supporting substrate may comprise a printed circuit board, so that surface mounting of such capacitor assembly has reduced amplitude vibrations transmitted to the printed circuit board, so as to provide both mechanical and electrical connection with relatively low noise characteristics.

Per still other alternatives, such terminations may comprise a layer of nickel-tin plating and/or may comprise nickel-tin plating over a copper film.

In other variations, the area of such transposer mounting pad may be approximately one-half or less of the area of such capacitor mounting pad, to effectively reduce the size of the mounting pads relative to the capacitor assembly.

Exemplary corresponding and/or related method may relate to methodology for relatively reducing electro-mechanical noise associated with a surface mountable multilayer ceramic capacitor (MLCC) capacitor assembly, preferably comprising providing a main body having a plurality of conductive layers of respective first and second polarities interleaved with a plurality of ceramic layers to form respective pairs of opposing capacitor plates in a stacked arrangement; forming respective first and second polarity terminations on such main body and electrically connected, respectively, to such first and second polarity conductive layers; and attaching a transposer mounting pad to such capacitor assembly and supporting such transposer mounting pad on a surface, for relatively reducing a supportive and connective footprint between such capacitor assembly and a surface by which it is supported for relatively reducing vibration force transmission therebetween for reducing electro-mechanical noise.

In variations of the foregoing, such attaching and supporting may include pre-mounting such transposer mounting pad to such capacitor assembly before supporting such transposer mounting pad on a surface.

Per other alternatives, a side of such main body facing such surface may form a capacitor mounting pad; and such methodology may further include providing a solder mask between such capacitor mounting pad and such transposer mounting pad.

Further alternatively, such respective first and second polarity terminations may be formed on opposite ends of such main body.

For other alternatives, such surface may comprise a supporting substrate, and/or such supporting substrate may comprise a printed circuit board, so that surface mounting of such capacitor assembly has reduced amplitude vibrations transmitted to the printed circuit board, so as to provide both mechanical and electrical connection with relatively low noise characteristics.

In other variations, such terminations may comprise a layer of nickel-tin plating and/or may comprise nickel-tin plating over a copper film. Per other alternatives of the foregoing, the area of such transposer mounting pad may be approximately one-half or less of the area of such capacitor mounting pad, to effectively reduce the size of the mounting pads relative to the capacitor assembly.

Additional objects and advantages of the presently disclosed subject matter are set forth in, or will be apparent to those of ordinary skill in the art from, the detailed description herein. Also, it should be further appreciated by those of ordinary skill in the art that modifications and variations to the specifically illustrated, referenced, and discussed features and/or steps hereof may be practiced in various embodiments and uses of the disclosed technology without departing from the spirit and scope thereof, by virtue of present reference thereto. Such variations may include, but are not limited to, substitution of equivalent means, steps, features, or materials for those shown, referenced, or discussed, and the functional, operational, or positional reversal of various parts, features, steps, or the like.

Still further, it is to be understood that different embodiments, as well as different presently preferred embodiments, of this technology may include various combinations or configurations of presently disclosed steps, features or elements, or their equivalents (including combinations of features, configurations, or steps thereof not expressly shown in the figures or stated in the detailed description).

BRIEF DESCRIPTION OF THE DRAWINGS

A full and enabling description of the presently disclosed subject matter, including the best mode thereof, directed to one of ordinary skill in the art, is set forth in the specification, which makes reference to the appended figures, in which:

FIGS. 6A and 6B are perspective and cross-sectional views, respectively, of another exemplary embodiment of the presently disclosed subject matter, involving molded packaging technology, for relatively reducing electro-mechanical noise.

Figure 1:
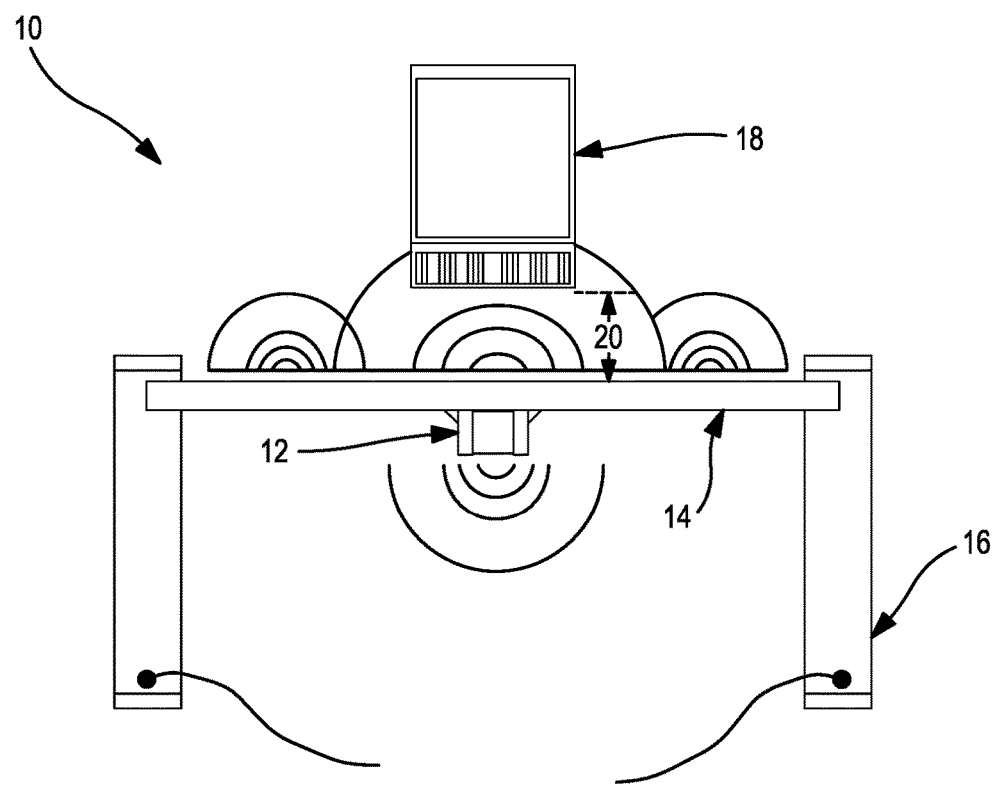
FIG. 1 illustrates a schematic view of an exemplary presently-devised test arrangement, for testing of either prior art devices or devices constructed and/or mounted in accordance with the presently disclosed technology.

Repeat use of reference characters throughout the present specification and appended drawings is intended to represent same or analogous features, elements, or steps of the presently disclosed subject matter.

DETAILED DESCRIPTION OF THE PREFERRED EMBODIMENTS

As discussed in the Summary of the Subject Matter section, the presently disclosed subject matter is generally concerned with certain noise aspects of mounted capacitor devices and related technology and manufacturing and/or mounting methodology. More particularly, the presently disclosed subject matter is concerned with improved designs for certain capacitor components and component assemblies associated with the implementation of surface mountable devices, and particularly as relates to providing low noise capacitors and related methodologies.

Selected combinations of aspects of the disclosed technology correspond to a plurality of different embodiments of the presently disclosed subject matter. It should be noted that each of the exemplary embodiments presented and discussed herein should not insinuate limitations of the presently disclosed subject matter. Features or steps illustrated or described as part of one embodiment may be used in combination with aspects of another embodiment to yield yet further embodiments. In additional, certain features may be interchanged with similar devices or features not expressly mentioned which perform the same or similar function.

Reference will now be made in detail to exemplary presently preferred embodiments, and for which FIG. 1 illustrates a schematic view of an exemplary presently-devised test arrangement generally 10, for testing of either prior art devices or devices constructed and/or mounted in accordance with the presently disclosed technology. Such a capacitor device generally 12 may be surface mounted or otherwise positioned relative to a substrate generally 14 such as a printed circuit board. In the arrangement devised, copper supports generally 16 are provided on respective sides of board 14 and may be energized during testing as represented by the indicated lead wires, and as will be understood by those of ordinary skill in the art from the illustrations of present FIG. 1.

A high-precision microphone generally 18 may be mounted a given distance generally 20 from the substrate 14. In an exemplary arrangement, a 2 mm distance may be practiced relative to substrate 14, which may comprise a 100×40×1.5 mm PCB. The surface mounted device generally 12 to be tested may include various case sizes, such as 0201 through 1206.

The device to be tested may be, for example, solder reflowed to pads in the center of the substrate. Use of the copper brackets 16 facilitate repeatable placements of test substrates, with the microphone positioned on the opposite side of the substrate from that where the device to be tested is mounted. A foam enclosure (not shown) may be provided around the entire arrangement to reduce stray noise. With such an arrangement, the noise floor may be approximately about −6 dB, over a frequency range of interest of about 1 to 10 kHz.

In an exemplary arrangement, a Brüel & Kjær ½" Microphone and Preamp were used in conjunction with a Brüel & Kjær Photon+ Signal Analyzer. An HP 33120A Function Generator was used in conjunction with a Krohn-Hite Model 7500 Amplifier used to energize the test item with a 1-5 kHz Swept Sine Wave; 3.15 VAC; 3.15 VDC; 0.1 s sweep rate. Most high CV capacitors tested had a 6.3V rating so test waveforms were set up to operate between 25% and 75% of 6.3 volts (about 1.6 to 4.7V).

While various set-up arrangements may be practiced, those of ordinary skill in the art will appreciate that such microphone geometry and placement provides an effective arrangement for capacitor electro-mechanical noise testing, as represented by the concentric half-circle vibration waves illustrated in FIG. 1, emanating from both the tested device 12 and the board 14.

Figure 2A:
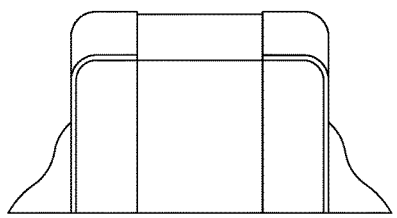
FIGS. 2A, 2B, 2C, and 2D are various perspective and cross-sectional views of prior art multi-layer ceramic capacitor (MLCC) devices.
Figure 2B:
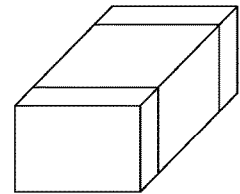
Figure 2C:
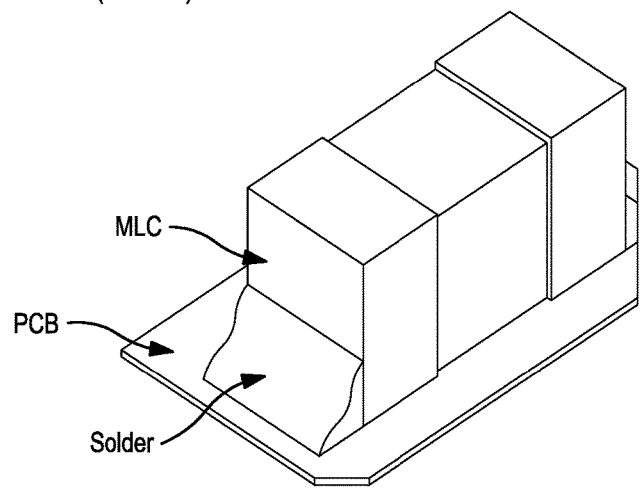
Figure 2D:
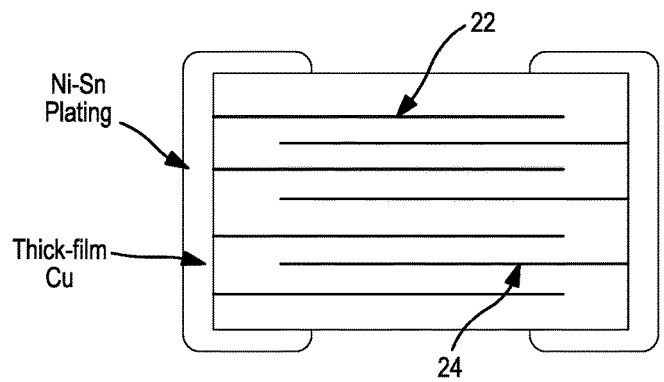
Figure 3:
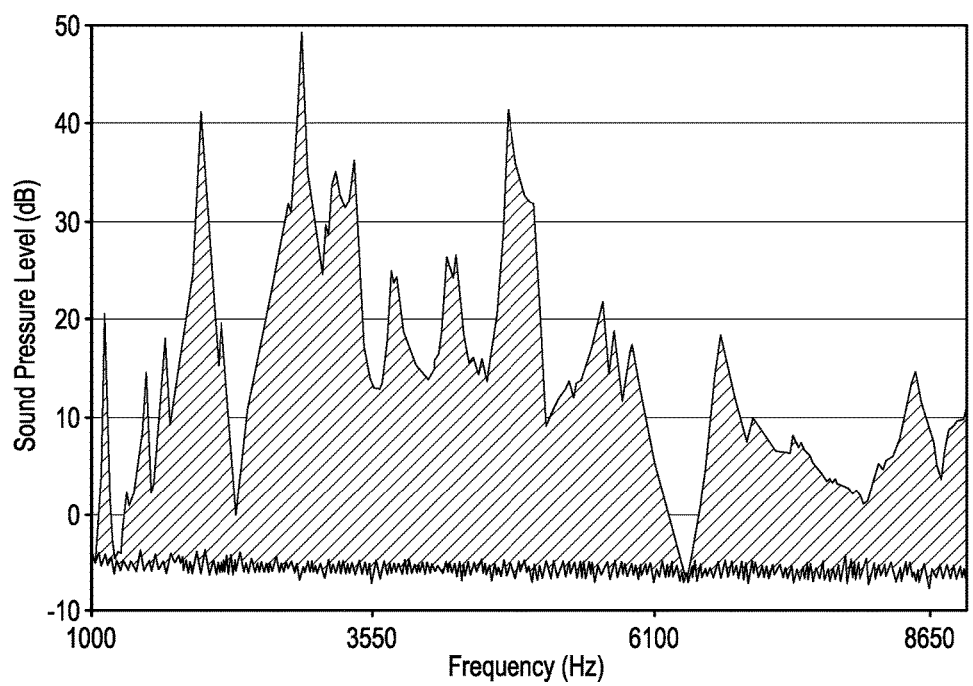
FIG. 3 is a graph of comparative sound pressure testing resulting from use of a testing arrangement as represented by present FIG. 1, performed on existing MLCC devices such as represented by present FIGS. 2A through 2D.

As otherwise discussed herein, present FIGS. 2A, 2B, 2C, and 2D are various perspective and cross-sectional views of prior art multi-layer ceramic capacitor (MLCC) devices, such as shown by FIGS. 2 and 3 of commonly owned U.S. Pat. No. 7,352,563. Such a MLCC may have, for example, a Ni—Sn plating over a thick film Cu termination, in conjunction with a main body having interdigitated or interlaced plural sets of electrode structures 22 and 24 of opposite polarity, as will be understood by those of ordinary skill in the art.

FIG. 3 is a graph of comparative sound pressure testing resulting from use of a testing arrangement as represented by present FIG. 1, performed on existing MLCC devices such as represented by present FIGS. 2A through 2D. It graphs sound pressure level (SPL) (in dBs) versus applied frequencies (in Hz). The noise floor is what's represented by an empty test chamber. As shown, a representative peak occurs per this testing at 49.3 dB, within the tested frequency range of between 1 to 9 kHz. A corresponding Figure of Merit indication is made out by the area under the SPL curve and in this instance amounts to about 2.0 Pa·Hz. The essentially same testing arrangement is used in conjunction with exemplary embodiments of the presently disclosed subject matter, as otherwise discussed herein.

Figure 4A:
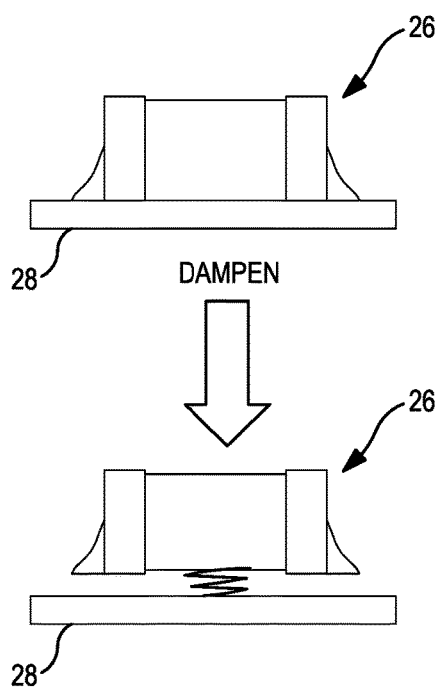
FIGS. 4A and 4B are schematic representations of aspects of mounting MLCC devices on printed circuit boards (PCBs)
Figure 4B:
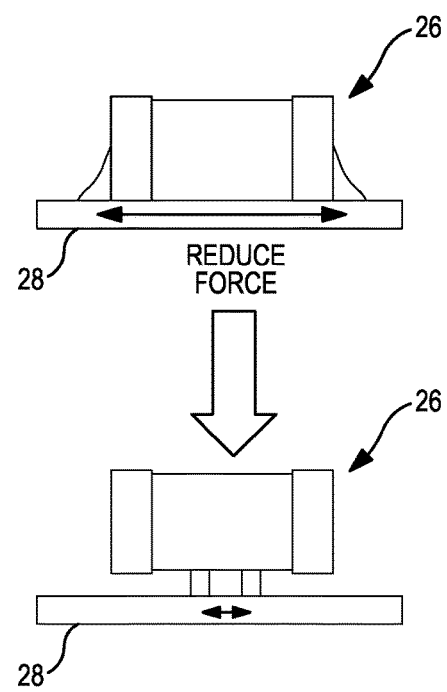

FIGS. 4A and 4B are simple schematic representations of aspects of mounting MLCC devices on printed circuit boards (PCBs), in accordance with presently disclosed subject matter, and which contribute to reductions in electro-mechanical noise from such combinations. As represented, a representative presently disclosed MLCC device generally 26 is received (mounted and/or supported) relative to a supporting substrate generally 28 (such as a PCB). FIG. 4A represents technological approaches which provide a dampening aspect in such combination as between device 26 and substrate 28. FIG. 4B represents resulting force reductions which can otherwise cause mechanical forces and resulting noise in the supporting substrate. As schematically shown by such embodiments, there is a reduction in the supportive/connective footprint as between the device 26 and substrate 28, resulting in particularized arrangements of reduced vibration force transmission between the two.

Figure 5A:
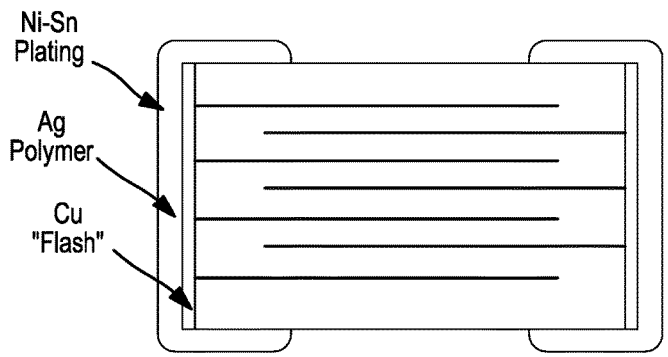
FIG. 5A is a cross-sectional view of exemplary first embodiment of the presently disclosed subject matter, involving compliant termination technology, for relatively reducing electro-mechanical noise.
Figure 5B:
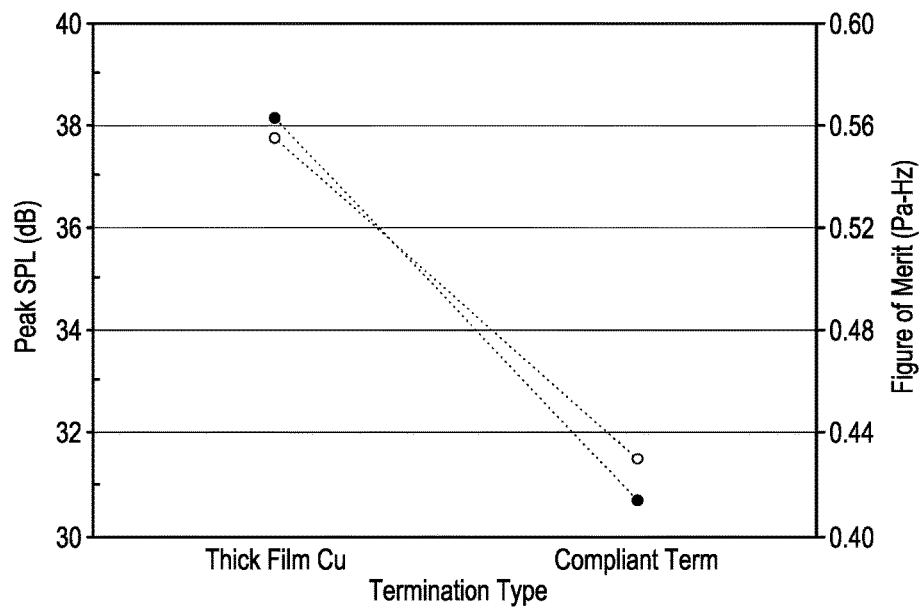
FIG. 5B is a graph of testing resulting from use of a testing arrangement as represented by present FIG. 1, performed on the presently disclosed exemplary embodiment such as represented by present FIG. 5A.

FIG. 5A is a cross-sectional view of an exemplary first embodiment of the presently disclosed subject matter, involving compliant termination technology, for relatively reducing electro-mechanical noise. FIG. 5B is a graph of testing resulting from use of a testing arrangement as represented by present FIG. 1, performed on the presently disclosed exemplary embodiment such as represented by present FIG. 5A, and comparing such results with results for a prior art thick Cu film terminated device, such as represented in prior art present FIG. 2D.

In contrast to the thick film copper termination of prior art FIG. 2D, the presently disclosed FIG. 5A exemplary embodiment has an Ag-Polymer termination over a relatively thinner Cu layer (or "flashing"). Such more compliant polymer termination acts as "cushion" and dampens against the coupling of vibrations between the capacitor device and the PCB. While Ag-polymer is shown as a specific example, it is to be understood by those of ordinary skill in the art from the complete disclosure herewith that more generally conductive polymer or polymer may be practiced rather than being restricted to only Ag-polymer.

As shown by present FIG. 5B, test results for the presently disclosed embodiment of present FIG. 5A are represented by the right side datapoints, and compare with the left side datapoints from the prior art device (of FIG. 2D). A reduction of about 6 dB is achieved. Since the dB axis is logarithmic, the reduction represented is on the order of magnitude of cutting the transmitted sound (SPL or noise) by half. The thick film copper termination prior art embodiment (FIG. 2D) has about a 120 GPa Modulus while the presently disclosed subject matter exemplary embodiment of FIG. 5A has a less than 5 GPa Modulus. Such exemplary embodiments for testing purposes involved 0805 10 micro-Farad MLCC devices. Thus, the compliant termination presently disclosed embodiment is shown to have a significant noise reduction over the prior art embodiment.

Figure 6C:
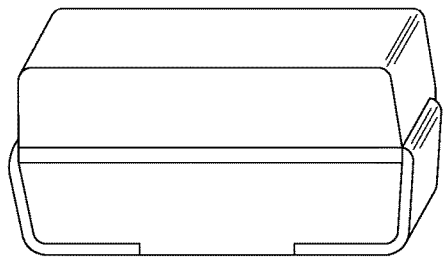
FIG. 6C is a graph of testing resulting from use of a testing arrangement as represented by present FIG. 1, performed on the presently disclosed exemplary embodiment such as represented by present FIGS. 6A and 6B.
Figure 6C:
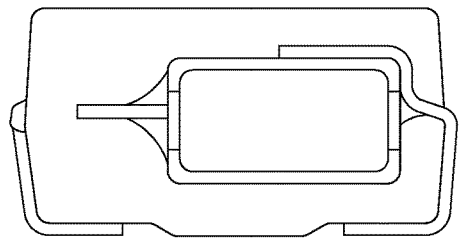
Figure 6C:
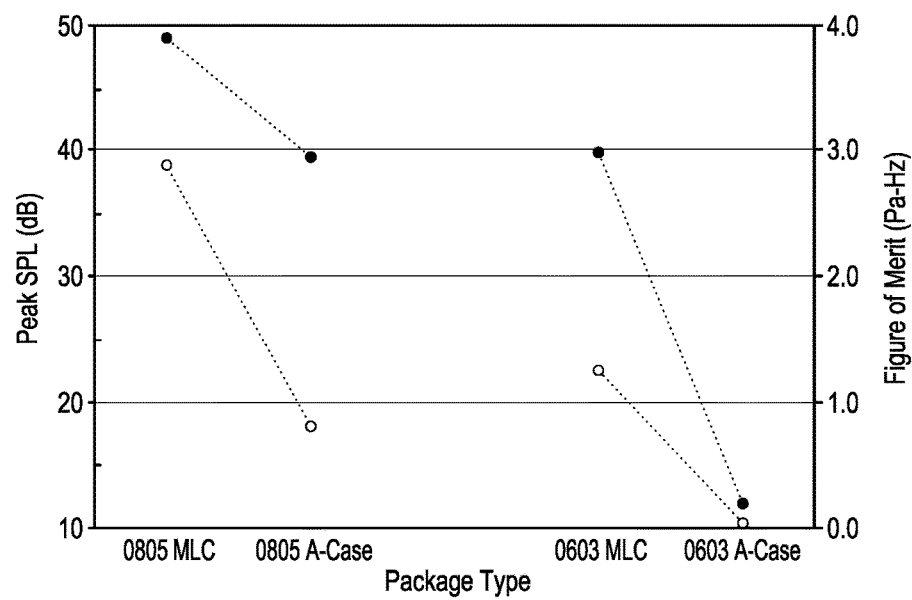

FIGS. 6A and 6B are perspective and cross-sectional views, respectively, of another exemplary embodiment of the presently disclosed subject matter, involving molded packaging technology, for relatively reducing electro-mechanical noise. FIG. 6C is a graph of testing resulting from use of a testing arrangement as represented by present FIG. 1, performed on the presently disclosed exemplary embodiment such as represented by present FIGS. 6A and 6B.

The subject molded package embodiment involves use of a lead frame to decouple capacitor distortion from the PCB. The length of the wire path and the respective top and end attachment points as shown provide such decoupling. Also, a polymer coating helps to dampen device noise. Further, a so-called A-case package mounts as LGA (land grid array) style package on 0805 solder pads.

FIG. 6C graphical represents test results between a standard 0805 MLCC device (of the style as presented by present prior art FIG. 2D) versus an 0805 A-case sample, using the molded packaging technology presently disclosed, for a 22 microFarad device. As shown, the presently disclosed technology provides anywhere from a 12 to 28 dB reduction in the peak SPL, thus representing significant improvement over the prior art.

Figure 6D:
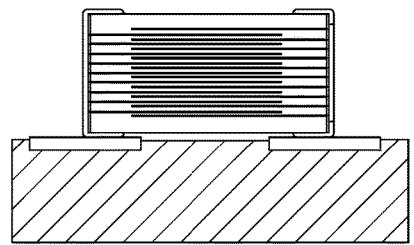
FIGS. 6D through 6F show conceptual cross-section views of three different respective exemplary embodiments of capacitors and solder pads on mounting substrates.
Figure 6E:
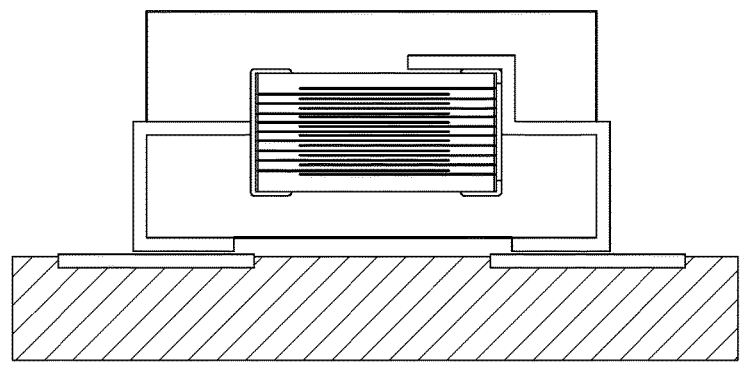
Figure 6F:
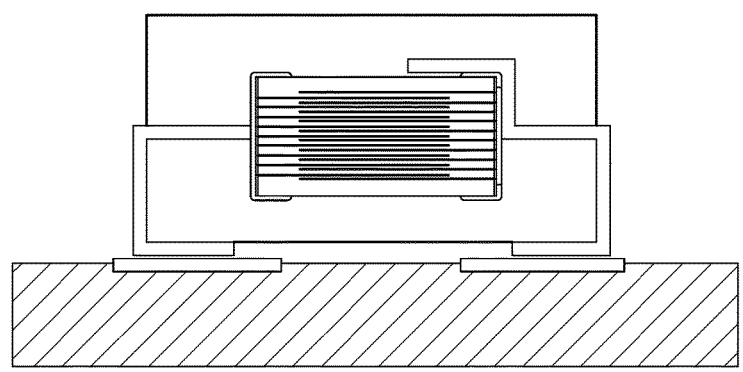

FIGS. 6D through 6F show conceptual cross-section views of three respective different exemplary embodiments of capacitors and solder pads on mounting substrates. FIG. 6D is a multilayer ceramic capacitor device on corresponding mounting pads, that is, an 0402 MLC mounts on pads designed for an 0402 device, 0603 MLC on 0603 pads, and so forth. FIG. 6E shows a given MLC capacitor inserted in a molded device that is physically larger than MLC itself, such that the molded device mounts on solder pads designed for that case-size molded part. Per EIA industry standards, R- and N-case size molded devices mount on 0805 solder pads, A-case molded parts mount on 1206 solder pads, and B-case molded devices mount on 1210 pads, and so forth. In particular, such industry standard mounting allows solder fillets to form on the ends of the molded devices, as shown conceptually in FIG. 6E. However, if molded devices are mounted on solder pads designed for one case size smaller chip, as shown conceptually in FIG. 6F, then solder fillets on the end of the molded device are substantially eliminated. In other words, R- and N-case size molded devices would be mounted on 0603 pads, A-case devices on 0805 pads and B-case devices on 1206-pads, and so forth.

Figure 6G:
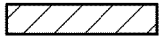
FIG. 6G shows graphically acoustic outputs of exemplary embodiments as Peak Sound Pressure Level, in dB.
Figure 6G:
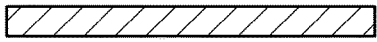
Figure 6G:
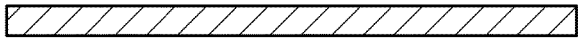
Figure 6G:
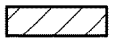
Figure 6G:
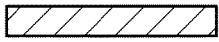
Figure 6G:
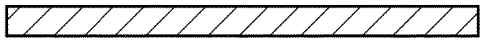

As shown graphically in FIG. 6G, it is possible to compare the acoustic output as Peak Sound Pressure Level, in dB, of a typical 0603 MLC with capacitance in the range of 2.2 to 22 µF mounted on 0603 mounting pads; an A-case molded device containing MLC inserts of the same range of values molded on industry standard 1206 mounting pads; and those A-case devices mounted on smaller 0805 pads that eliminate solder-end fillets. The acoustic output of A-case molded devices is reduced relative to the bare MLC inserts, and furthermore the acoustic output of the molded device mounted on solder pads that eliminate the solder-end fillets is reduced relative to the molded device mounted with solder fillets.

As shown graphically in FIG. 6G, it is possible to compare the acoustic output as Peak Sound Pressure Level, in dB, of a typical 0402 MLC with capacitance in the range of 0.1 to 10 µF mounted on 0402 mounting pads; an R-case molded device containing MLC inserts of the same range of values molded on industry standard 0805 mounting pads; and those R-case devices mounted on smaller 0603 pads that eliminate solder-end fillets. The acoustic output of R-case molded devices is reduced relative to the bare MLC inserts, and furthermore the acoustic output of the molded device mounted on solder pads that eliminate the solder-end fillets is reduced relative to the molded device mounted with solder fillets. Table 1 lists several examples of industry standard molded devices and MLC's and non-standard Land-Grid-Array (LGA) mount pad geometries that minimize solder-end fillets to reduce acoustic output.

TABLE 1

| Molded Device Size | EIA MLC Insert Size | Industry Standard Mounting Pad Size for Molded Part | Low Noise "LGA" Mounting Pad Size for Molded Part |
| --- | --- | --- | --- |
| A-Case | 0603 | 1206 | 0805 |
| B-Case | 0805 | 1210 | 1206 or 0805 |
| R-Case | 0402 | 0805 | 0603 |
| N-Case | 0402 | 0805 | 0603 |

Figure 7A:
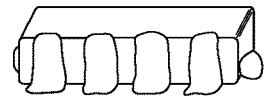
FIG. 7A is a representative example of an 8-terminal MLCC device in accordance with the prior art device designs of present FIGS. 2A through 2D.
Figure 7B:
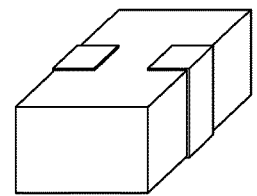
FIG. 7B is a perspective view of another exemplary embodiment of the presently disclosed subject matter, involving side terminal technology, for relatively reducing electro-mechanical noise.
Figure 7C:
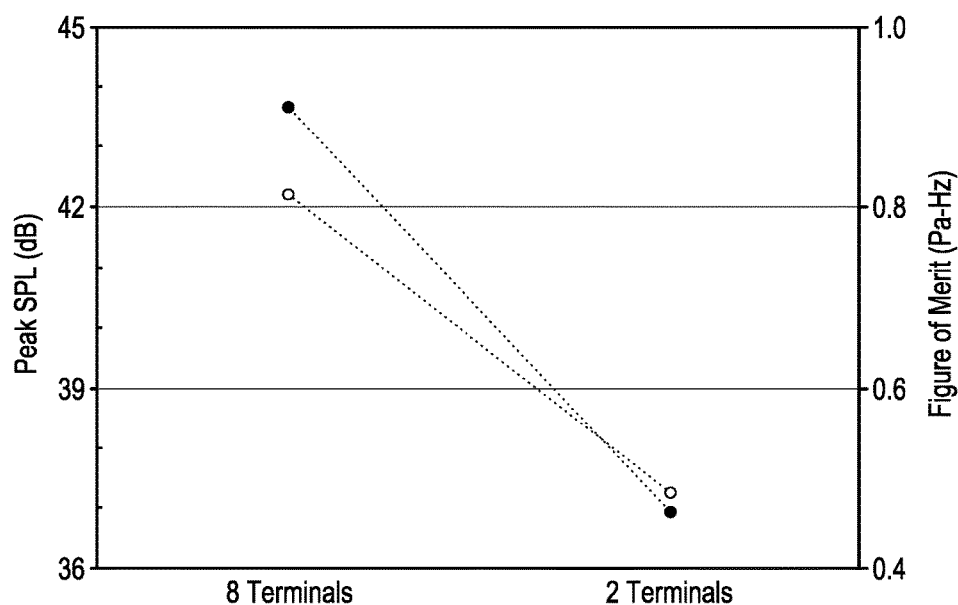
FIG. 7C is a graph of testing resulting from use of a testing arrangement as represented by present FIG. 1, performed on the presently disclosed exemplary embodiment such as represented by present FIG. 7B.

FIG. 7A is a representative example of an 8-terminal MLCC device in accordance with the prior art device designs of present FIGS. 2A through 2D. FIG. 7B is a perspective view of another exemplary embodiment of the presently disclosed subject matter, involving side terminal technology, for relatively reducing electro-mechanical noise. FIG. 7C is a graph of testing resulting from use of a testing arrangement as represented by present FIG. 1, performed on the presently disclosed exemplary embodiment such as represented by present FIG. 7B, and comparing results from such testing with testing on a prior art embodiment such as shown by present FIG. 7A. The side terminal exemplary embodiment utilizes reduction functionality and subject matter such as represented generally by present FIG. 4B, with a relatively reduced coupling footprint. Again, reduction of about 6 dB is shown by the comparative test results of present FIG. 7C.

Figure 8A:
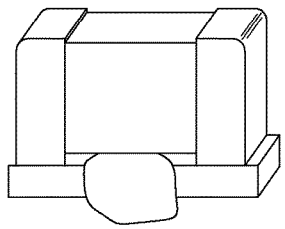
FIGS. 8A through 8C are perspective and component side elevational and board side elevational views, respectively, of another exemplary embodiment of the presently disclosed subject matter, involving pre-mounted MLCC transposer technology, for relatively reducing electro-mechanical noise.
Figure 8B:
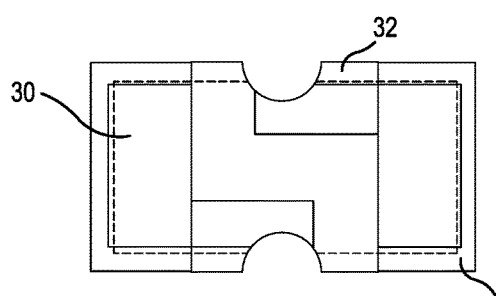
Figure 8C:
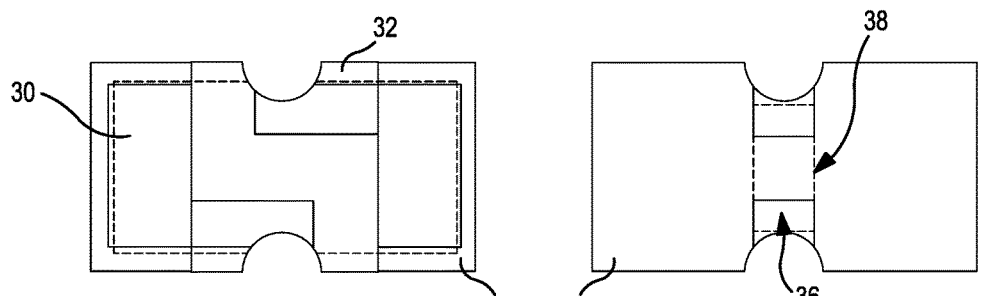
Figure 8D:
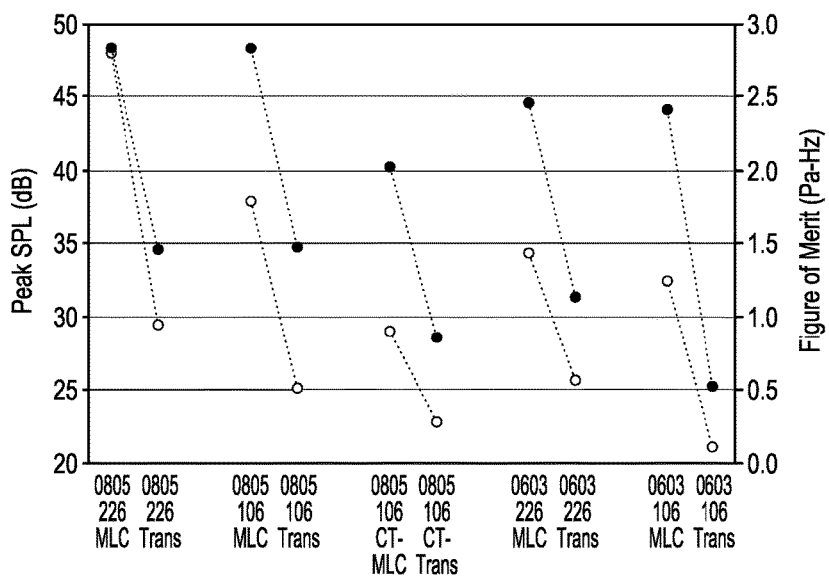
FIG. 8D is a graph of testing resulting from use of a testing arrangement as represented by present FIG. 1, performed on the presently disclosed exemplary embodiment such as represented by present FIGS. 8A through 8C.

FIGS. 8A through 8C are perspective and component side elevational and board side elevational views, respectively, of another exemplary embodiment of the presently disclosed subject matter, involving pre-mounted MLCC transposer technology, for relatively reducing electro-mechanical noise. FIG. 8D is a graph of testing resulting from use of a testing arrangement as represented by present FIG. 1, performed on the presently disclosed exemplary embodiment such as represented by present FIGS. 8A through 8C, and compared with a prior art MLCC embodiment such as the design of present FIG. 2D. Again, an 0805 size device is used for some of the comparison datapoints, while (as shown) 0603 size embodiments are utilized in some instances. The term "transposer" is used because literally the location of the mounting pads is transposed for a given case size MLCC to pads for smaller case sized devices. This results in a reduction in the effective bonding area, a decrease of the span between mounting pads, reduction of the LGA-type solder fillet, and an increase in the MLCC device stand-off.

For example, FIG. 8B illustrates from the component side, an 0603 footprint generally for the capacitor mounting pad generally 30 as used with solder mask 32 for mounting on representative substrate 34. However, FIG. 8C, illustrating from the board (or substrate) side, shows that the transposer mounting pad generally 36 results in an 0201 footprint (generally dotted line area 38). Thus, the Electronic Industries Alliance (EIA) mounting size is transposed by such embodiments. Note that EIA case size codes as discussed herein are with reference to inches. The following Table 2 reflects the various reductions in effective bonding areas which may be achieved with practice of such presently disclosed subject matter. Further, FIG. 8D represents graphical illustration of the significant peak SPL data reductions (on the order of 12 to 20 dB) achieved by such presently disclosed devices relative to prior art MLCC devices. Such FIG. 8D graph also represents 60 to 90% reductions in the Figure of Merit (FOM) data.

TABLE 2

| EIA MLC Size | Transposed Mounting Size |
|---|---|
| 1206 | 0603 |
| 0805 | 0402 |
| 0603 | 0201 |

Figure 9:
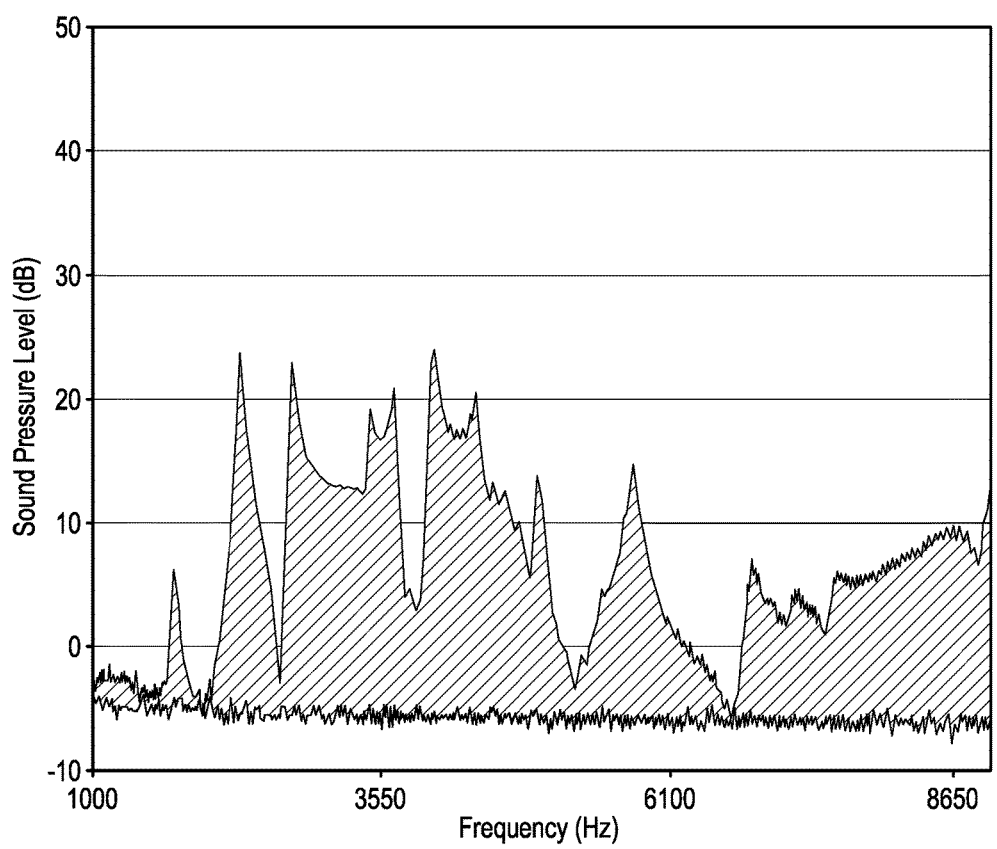
FIG. 9 is a graph of comparative sound pressure testing resulting from use of a testing arrangement as represented by present FIG. 1, performed on presently disclosed MLCC devices pre-mounted on a substrate such as represented by present FIGS. 8A through 8C.

Present FIG. 9 is a graph of comparative sound pressure level testing resulting from use of a testing arrangement as represented by present FIG. 1, performed on presently disclosed MLCC devices pre-mounted on a substrate such as represented by present FIGS. 8A through 8C. As shown, the peak SPL shown over the 1 to 9 KHz range is about 23.8 dB, which is far less than the 49.3 dB peak SPL show in the graph of present FIG. 3. Likewise, the Figure of Merit is reduced to an area determination of about 0.4 Pa·Hz, down from the about 2.0 Pa·Hz datapoint obtained in conjunction with FIG. 3 testing. Comparison testing summaries relative to such FIG. 3 graph for the four different exemplary embodiments of presently disclosed subject matter is set forth in the following Table 3.

TABLE 3

| | Peak SPL Reduction | FOM Reduction |
|---|---|---|
| Compliant Terminal | 7.5 dB | 23% |
| Molded MLC | 12-28 dB | 70-97% |
| Side Terminal | 5 dB | 49% |
| Transposer | 12-19 dB | 60-90% |

The following Table 4 summarizes the relative efficacy of presently disclosed embodiments of electro-mechanical noise (peak SPL) reduction relative to size adjustment and cost factors. Such comparative aspects may tend to indicate selection of one particular presently disclosed embodiment over another for a particular application or set of user needs/criteria.

TABLE 4

| E-M Noise Technology | SPL Reduction | Size Adjustment Factor | Cost Adjustment Factor |
|---|---|---|---|
| Compliant Termination (FIG. 5A) | Good | Low | Low |
| Molded MLC (FIGS. 6A-6C) | Excellent | High | High |
| Side Terminal (FIG. 7B) | Good | Low | Moderate |
| MLC Transposer (FIGS. 8A-8C) | Very Good | Moderate | High |

While the presently disclosed subject matter has been described in detail with respect to specific embodiments thereof, it will be appreciated that those skilled in the art, upon attaining an understanding of the foregoing may readily adapt the presently disclosed technology for alterations or additions to, variations of, and/or equivalents to such embodiments. Accordingly, the scope of the present disclosure is by way of example rather than by way of limitation, and the subject disclosure does not preclude inclusion of such modifications, variations, and/or additions to the presently disclosed subject matter as would be readily apparent to one of ordinary skill in the art.

What is claimed is:

1. A surface mountable relatively low noise multilayer ceramic capacitor (MLCC) assembly, comprising:
   a main body having a plurality of conductive layers of respective first and second polarities interleaved with a plurality of ceramic layers to form respective pairs of opposing capacitor plates in a stacked arrangement;
   respective first and second polarity terminations on opposite ends of said main body and electrically connected, respectively, to said first and second polarity conductive layers; and
   one or more vibration dampening members, wherein at least a portion of the one or more vibration dampening members is configured to be attached to a mounting surface, wherein the one or more vibration dampening members comprise
   a compliant layer included with the terminations, wherein the terminations include a first layer adjacent each opposite end of said main body and the compliant layer is disposed over the first layer, and wherein the compliant layer includes a polymer, and wherein the compliant layer is configured to dampen vibrations and reduce electro-mechanical noise such that the capacitor assembly has a figure of merit less than about 0.52 Pa·Hz.

2. The multilayer ceramic capacitor (MLCC) assembly of claim 1, wherein the compliant layer directly contacts the first layer.

3. The multilayer ceramic capacitor (MLCC) assembly of claim 1, wherein the compliant layer comprises:
   a layer of compliant polymer.

4. The multilayer ceramic capacitor (MLCC) assembly of claim 3, wherein the compliant polymer comprises:
   a conductive polymer.

5. The multilayer ceramic capacitor (MLCC) assembly of claim 1, wherein the compliant layer comprises a silver-polymer.

6. The multilayer ceramic capacitor (MLCC) assembly of claim 1, wherein the compliant layer comprises a copper filled polymer.

7. The multilayer ceramic capacitor (MLCC) assembly of claim 1, wherein the compliant layer has a modulus of elasticity of less than 5 GPa.

8. A surface mountable relatively low noise multilayer ceramic capacitor (MLCC) assembly, comprising:
   a main body having a plurality of conductive layers of respective first and second polarities interleaved with a plurality of ceramic layers to form respective pairs of opposing capacitor plates in a stacked arrangement;
   respective first and second polarity terminations on opposite ends of said main body and electrically connected, respectively, to said first and second polarity conductive layers; and
   one or more vibration dampening members, wherein at least a portion of the one or more vibration dampening members is configured to be attached to a mounting surface, wherein the one or more vibration dampening members comprise a compliant layer included with the terminations, wherein the terminations include a first layer adjacent each opposite end of said main body, and the compliant layer is disposed over the first layer, and wherein the compliant layer includes a polymer, and wherein the compliant layer has a modulus of elasticity of less than 5 GPa such that the compliant layer dampens vibrations and reduces electro-mechanical noise such that the capacitor assembly has a figure of merit less than about 0.52 Pa-Hz.

\* \* \* \* \*